(12) United States Patent
Hwang et al.

(10) Patent No.: US 6,204,129 B1
(45) Date of Patent: Mar. 20, 2001

(54) METHOD FOR PRODUCING A HIGH-VOLTAGE AND LOW-VOLTAGE MOS TRANSISTOR WITH SALICIDE STRUCTURE

(75) Inventors: Ching-Chun Hwang, Taichung; Wei-Chung Chen, Hsin-Chu; Chien-Kuo Yang, Taipei, all of (TW)

(73) Assignee: United Microelectronics Corp, Hsin-Chu (TW)

( * ) Notice: Subject to any disclaimer, the term of this patent is extended or adjusted under 35 U.S.C. 154(b) by 0 days.

(21) Appl. No.: 09/425,606

(22) Filed: Oct. 22, 1999

(51) Int. Cl.[7] ............................................... H01L 21/8234
(52) U.S. Cl. ............................................ 438/275; 438/655
(58) Field of Search ..................................... 438/200, 275, 438/305, 306, 307, 655, 656

(56) References Cited

U.S. PATENT DOCUMENTS

| | | | |
|---|---|---|---|
| 6,008,077 | * 12/1999 | Maeda | 438/275 |
| 6,010,929 | * 1/2000 | Chapman | 438/275 |
| 6,077,736 | * 12/1999 | Hwang et al. | 438/275 |

* cited by examiner

Primary Examiner—Chandra Chaudhari

(57) ABSTRACT

A method for producing self-aligned silicidation, substantially facilitating the integration of the high-voltage and low-voltage MOS device, is disclosed. The method includes providing, the present invention provides a integration of high-voltage and low-voltage MOS transistor, which self-aligned silicidation process. A substrate is provided incorporating a device, wherein the device is defined high-voltage MOS region and low-voltage MOS region. Sequentially, a plurality of field oxides are formed on the substrate, one of the field oxide is spaced from another of the field oxide by a MOS region. Moreover, a polysilicon layer is formed over said high-voltage MOS region and low-voltage MOS region, and a first dielectric layer is deposited above the polysilicon layer of the high-voltage MOS region and low-voltage MOS region. Consequently, a first photoresist layer is formed over the first dielectric layer, wherein defining and etching the first photoresist layer to form gates of high-voltage MOS and low-voltage MOS. Then, using said second photoresist layer as a mask above low-voltage MOS region, firstly implanting the substrate of the high-voltage MOS region to form conductivity-type grade therein, and then the second photoresist layer of low-voltage MOS region is removed. Moreover, spacers are formed on sidewall of said gates of high-voltage MOS and low-voltage MOS, and then a second dielectric layer is formed on the substrate of high-voltage and low-voltage MOS.

22 Claims, 5 Drawing Sheets

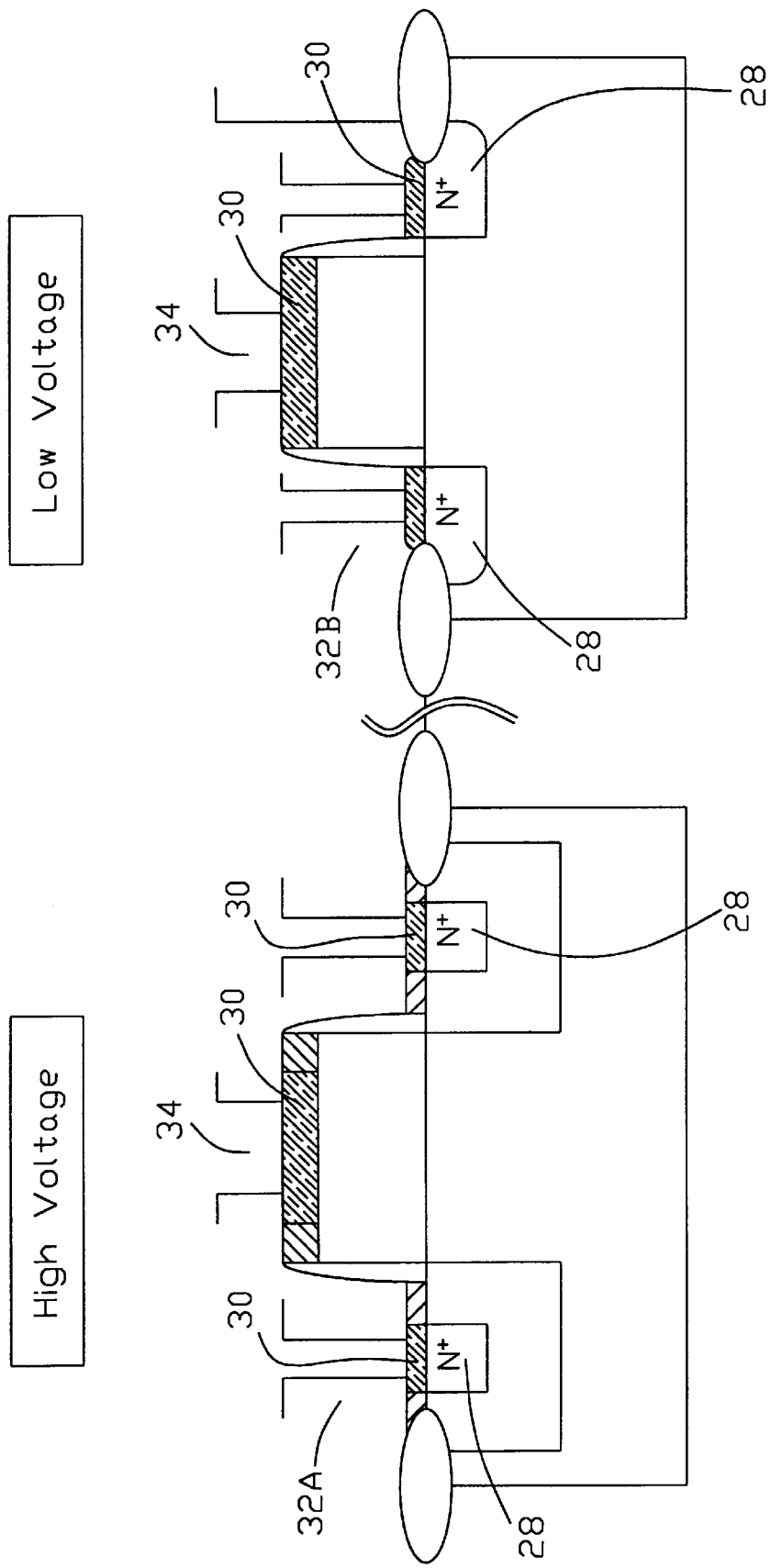

METHOD FOR PRODUCING A HIGH-VOLTAGE AND LOW-VOLTAGE MOS TRANSISTOR WITH SALICIDE STRUCTURE

BACKGROUND OF THE INVENTION

1. Field of the Invention

The present invention relates to integration of high-voltage and low-voltage MOS transistors, and more particularly, to a method for producing high-voltage and low-voltage salicide process.

2. Description of the Prior Art

As the scale of integrated circuits (ICs) has been rapidly decreased, the design and layout rule becomes more stringent. Moreover, as the integrated circuits (ICs) are fabricated to be more compact, the integration of ICs with different application becomes indispensable.

In the conventions, the integration of the high-voltage and low-voltage MOS transistors are majoring used to polycide process without salicide process. The great of reasons are

- for the sake to strengthen the ability of junction breakdown in high-voltage MOS transistor, the $N^+$-type region to polysilicon layer of gate has N-type grade area, while implanting the energy with N-type ions into the grade is usually considerably height (>100 KeV). Therefore, according to the old tradition of the salicide process of polysilicon layer with the gate, the high energy of implanting N-type grade is embedded in the channel under polysilicon layer of result in the shift of threshold voltage of high-voltage MOS transistor.
- the silicidation region is not formed above the top surface of N-type grade region. If the silicidation region is formed, the current will flow along the upper surface with silicidation region to reduce the ability of junction breakdown.

FIGS. 1A and 1B shows the cross section of a conventional high-voltage and low-voltage MOS transistors, which usually includes a silicon substrate 100, field oxide regions 120, an $N^+$-type source/drain region 160 of high-voltage and low-voltage MOS transistors, a polysilicon layer 140, and a WSi layer 200. Then, the N-type grade region is only formed in the substrate of high-voltage MOS transistor. In the structure of the shown transistor, the silicidation region of the structure is not formed above the top surface of N-type grade region. If the silicidation region is formed, the current will flow along the upper surface with silicidation region to reduce the ability of junction breakdown.

For the foregoing reasons, there is a need for disclosing a structure and a method of fabricating high-voltage and low-voltage MOS transistors having self-aligned silicidation.

SUMMARY OF THE INVENTION

An object of the present invention is to substantially obviate one or more of the problems caused by limitations and disadvantages of the related art.

In accordance with the present invention, a method is provided for producing self-aligned silicidation of the high-voltage and low-voltage MOS devices, substantially facilitating the integration of the high-voltage and low-voltage MOS devices. Owing to the use of a method, so that the provided self-aligned silicidation process in the high-voltage and low-voltage MOS device can be adapted quality fabrication.

Another purpose of the present invention is to provide a silicon nitride layer on the gate, thereby avoiding the channeling effect of the implanting N-type grade.

Moreover, the present invention provides a high-voltage and low-voltage MOS transistor with $N^+$ mask design, thus enhancing self-aligned silicidation process in high-voltage and low-voltage MOS transistors.

In the embodiment, the present invention provides an integration of high-voltage and low-voltage MOS transistors, which have self-aligned silicidation process. A substrate is provided incorporating a device, wherein the device is defined high-voltage MOS region and low-voltage MOS region. Sequentially, a plurality of field oxides are formed on the substrate, one of the field oxide is spaced from another of the field oxide by a MOS region. Moreover, a polysilicon layer is formed above said high-voltage MOS region and low-voltage MOS region, and a first dielectric layer is deposited above the polysilicon layer of the high-voltage MOS region and low-voltage MOS region. Consequently, a first photoresist layer is formed over the first dielectric layer, wherein defining and etching the first photoresist layer to form gates of high-voltage MOS and low-voltage MOS. Then, using said second photoresist layer as a mask above low-voltage MOS region, firstly implanting the substrate of the high-voltage MOS region to form conductivity-type grade therein, and then the second photoresist layer of low-voltage MOS region is removed. . Moreover, spacers are formed on sidewall of said gates of high-voltage MOS and low-voltage MOS, and then a second dielectric layer is formed on the substrate of high-voltage MOS and low-voltage MOS. Subsequently, a third photoresist layer having a first pattern is formed on high-voltage MOS and a second pattern on the low-voltage MOS, wherein etching a portion of the first dielectric layer and the second dielectric layer until top surface of the polysilicon layer and the grade is exposed by using the third photoresist layer as a hard mask. Moreover, second conductivity type ions are implanted into the grade region of high-voltage MOS and into the substrate of low-voltage MOS using the third photoresist layer as a mask, and then the third photoresist layer is removed. Finally, the exposed polysilicon layer and the grade are sputtered to form silicide region.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 2A to 5B show cross-sectional views illustrative of various stages in the fabrication of a high-voltage and low-voltage metal-oxide-semiconductor transistor in accordance with one embodiment of the present invention.

DESCRIPTION OF THE PREFERRED EMBODIMENT

Referring to FIG. 2A–5B, the process flow of a preferred embodiment according to the present invention is depicted in cross-sectional views. These drawings merely show several key steps in sequential processes.

Figure 1A:
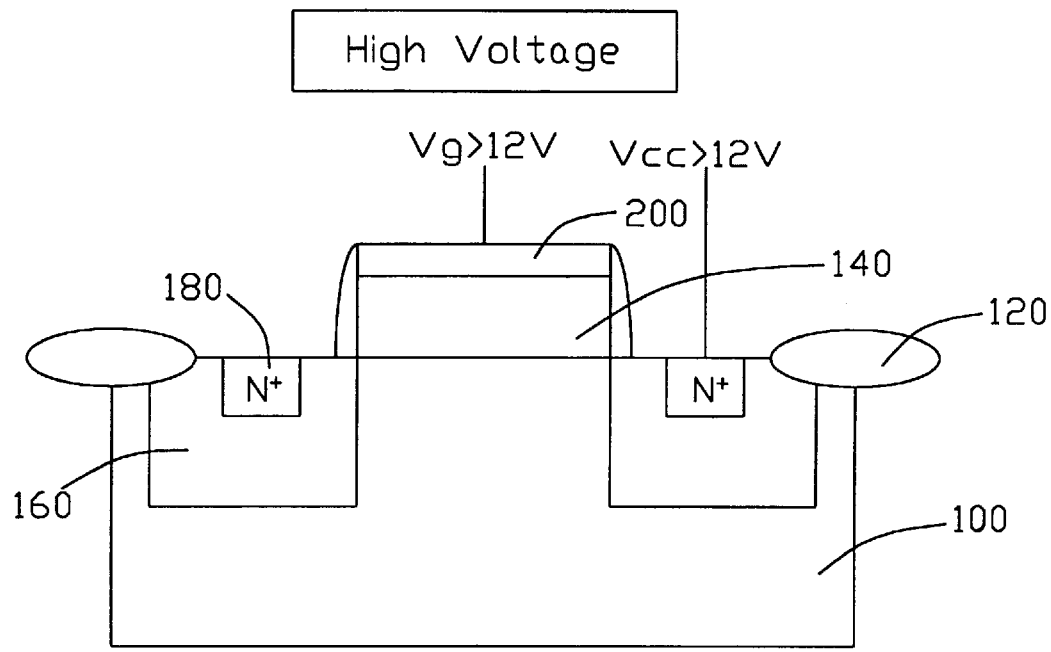
FIGS. 1A and 1B shows the cross section of a conventional high-voltage and low-voltage metal-oxide-semiconductor transistor.
Figure 1B:
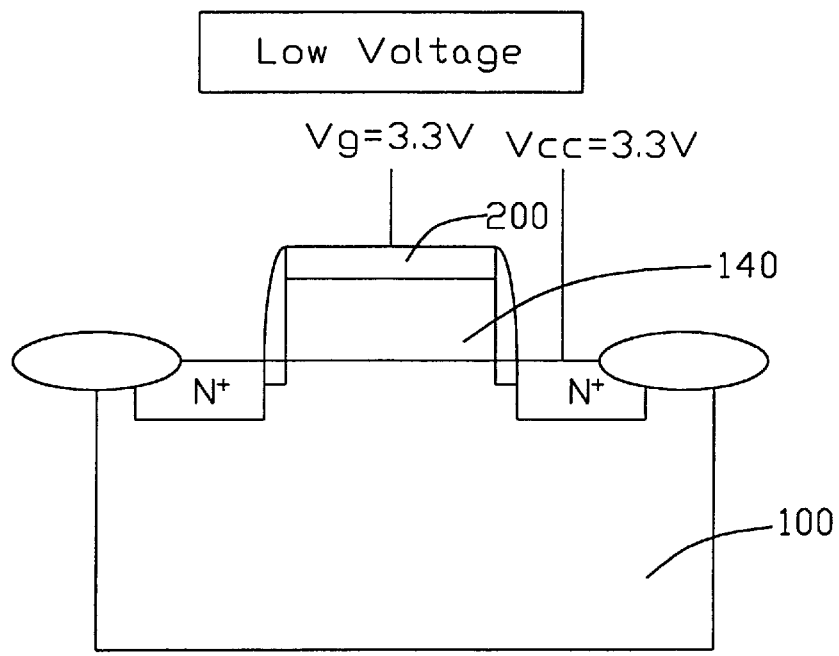
Figures 2A, 2B:
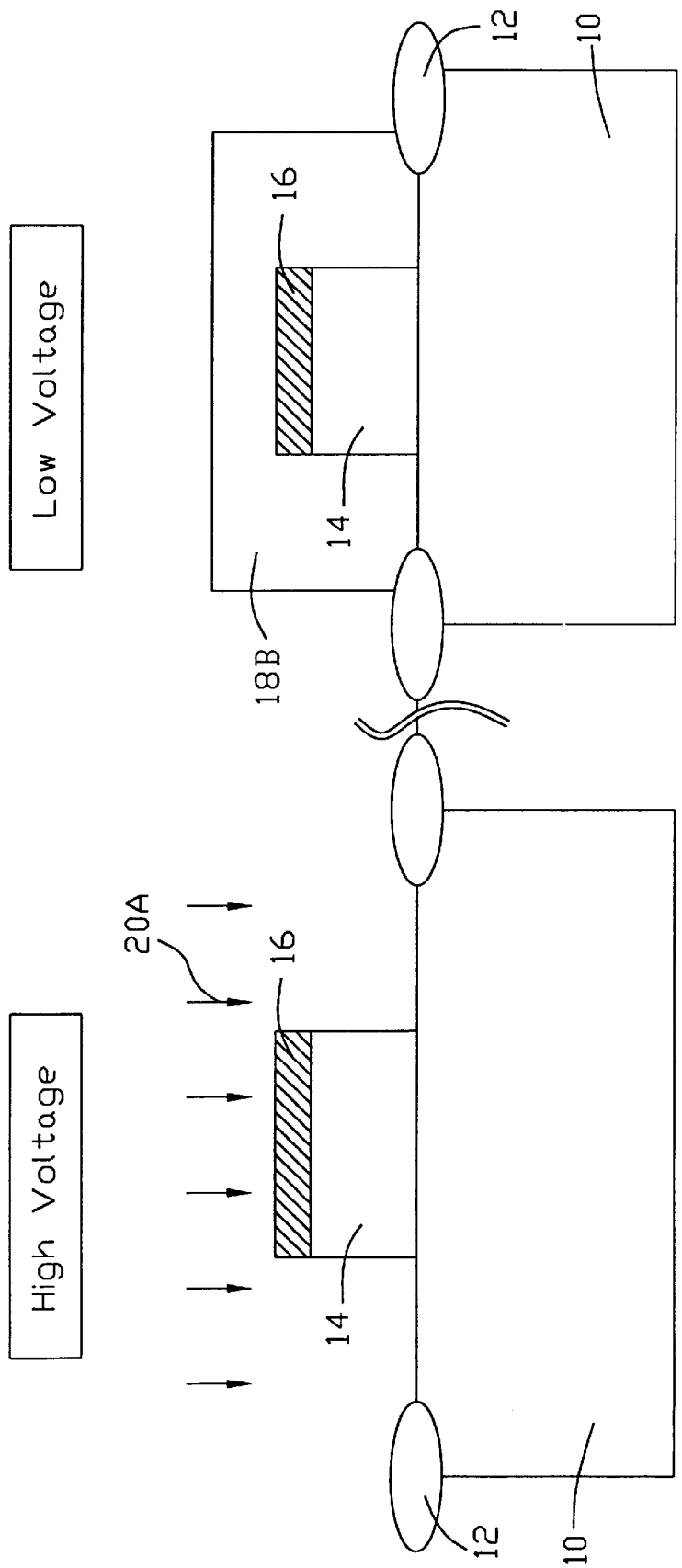

Referring to FIG. 2A and 2B, a silicon substrate 10 incorporating a device, wherein the device is defined high-voltage MOS region and low-voltage MOS region. And then a plurality of field oxides 12 are formed on the silicon substrate 10, one of the field oxides is spaced from another of the field oxide by a MOS region. Consequentially, a gate oxide layer (not shown) having a thickness of about 100–200 angstroms is formed on the silicon substrate 10 high-voltage MOS region and low-voltage MOS region. A conventional thermal oxidation process preferably forms this gate oxide layer (no shown). Subsequently, a conventional low-pressure chemical vapor deposition (LPCVD) is utilized to form a polysilicon layer 14 on the gate oxide of high-voltage MOS region and low-voltage MOS region. A polysilicon layer 14 with the thickness preferably about 3000 angstroms. Generally, the formation of the polysilicon layer 14 is implanted by doping ions, such as Phosphorus or Arsenic, thereinto, so that the resistivity of the gate 14 thus formed later can be substantially reduced. A silicon nitride layer 16 is then deposited on the gate 14. In this embodiment, the silicon nitride layer 16 is deposited by a standard low-pressure chemical vapor deposition (LPCVD) technique, and has a thickness of about 500 angstroms. Sequentially, a first photoresist layer 18B is formed above the silicon substrate 10 of high-voltage MOS and low-voltage MOS region, wherein defining and etching the first photoresist layer to form gates of high-voltage MOS and low-voltage MOS. Moreover, second photoresist layer is deposited above low-voltage MOS region. Using the second photoresist layer 18B as a mask above low-voltage MOS region, and implanting conductive ions 201 into the silicon substrate 10 of the high-voltage MOS region to form N-type grade therein. Therefore, the silicon nitride layer 16 of the high-voltage MOS region mentioned above would be used to avoid the channeling effect of implanting N-type grade.

Figures 3A, 3B:
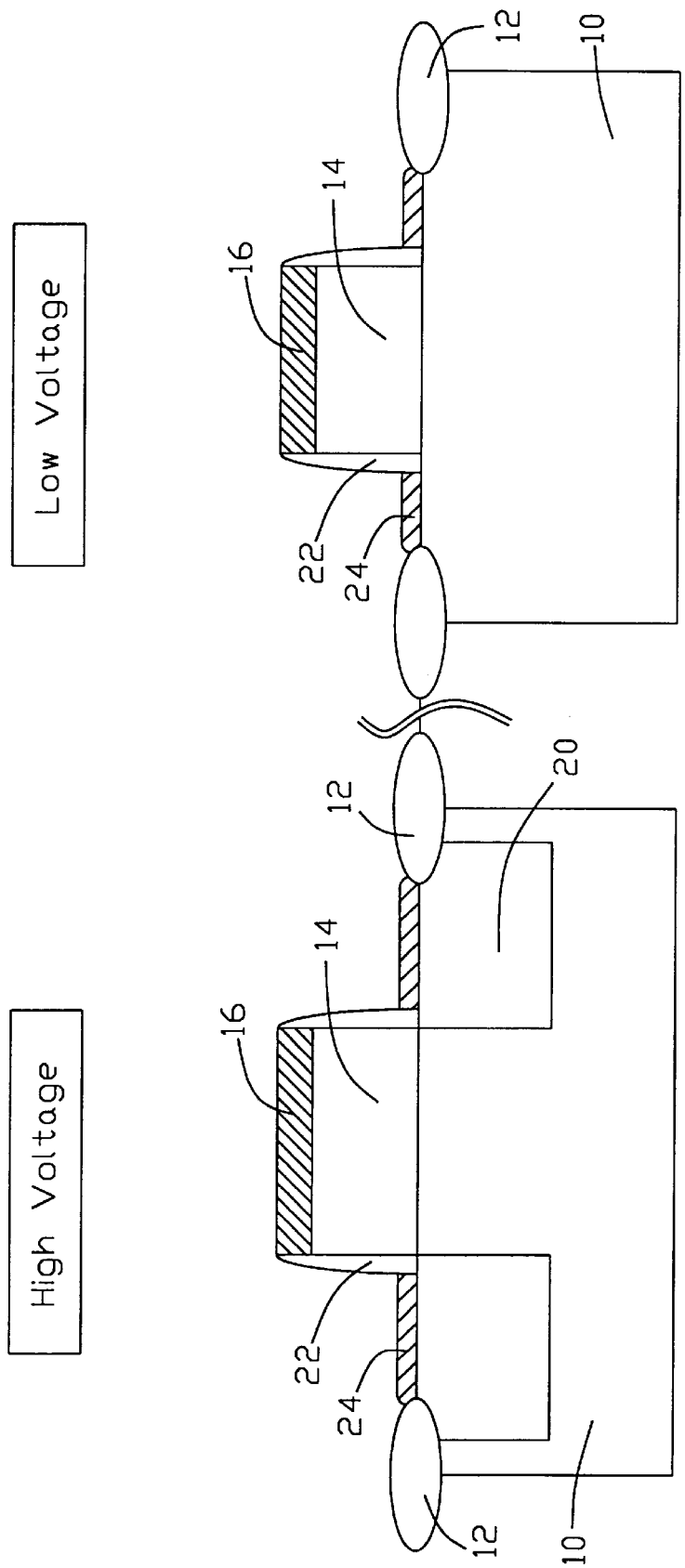

Referring to FIG. 3A and 3B, the second photoresist layer 18B above the substrate 10 of low-voltage MOS region is removed, and a dielectric spacers 22 is formed on the sidewalls of the gate of high-voltage MOS and low-voltage MOS regions consisting of silicon dioxide by anisotropically etch technique. Consequentially, a silicon dioxide layer 24 is abutted on the top surface of substrate 10 of high-voltage MOS and low-voltage MOS regions. A thermal oxidation process preferably forms the silicon dioxide layers 24.

Figures 4A, 4B:
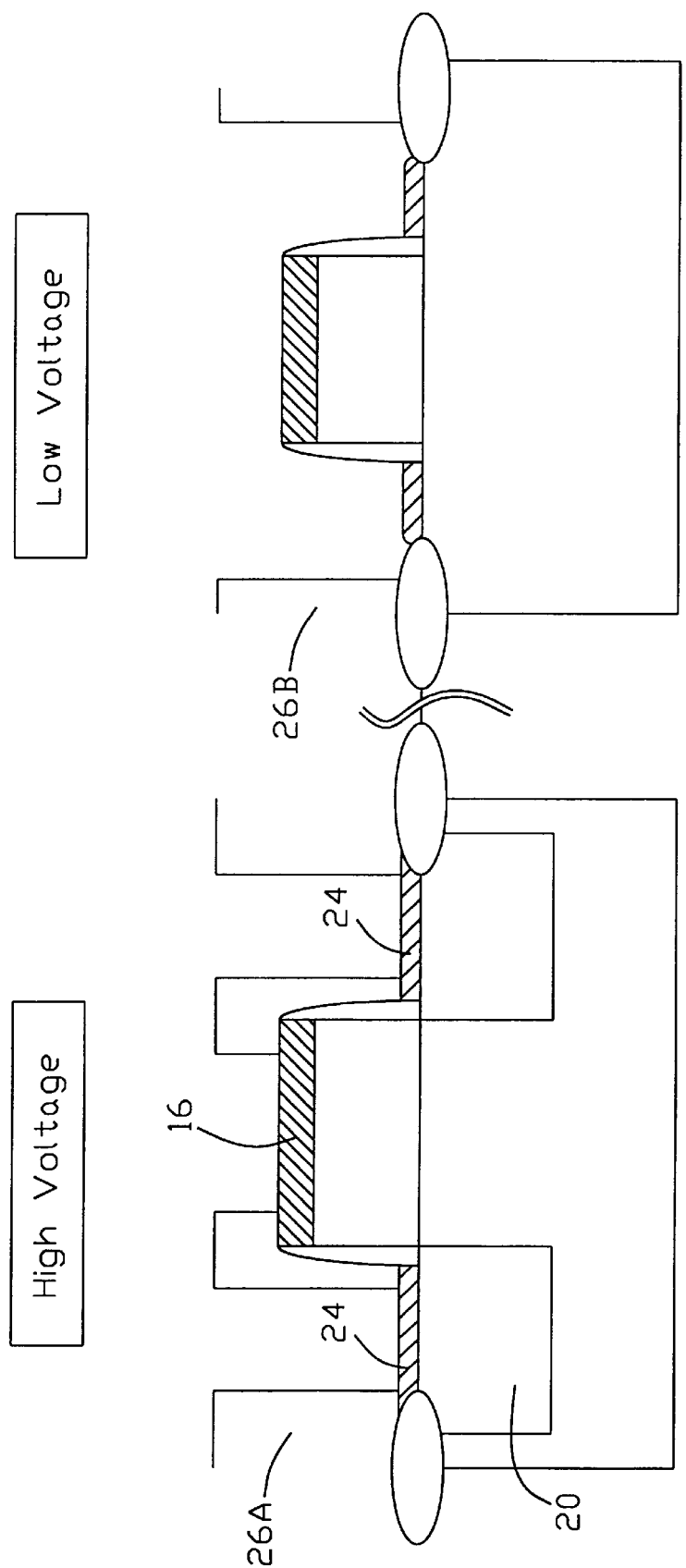

Referring to FIG. 4A and 4B, a third photoresist layer 26A and 26B is formed above the silicon substrate 10 having a first pattern on the high-voltage MOS and a second pattern on the low-voltage MOS. Moreover, in FIG. 5A and 5B, etching a portion of the silicon nitride layer 16 and the silicon dioxide layer 24 until top surface of the polysilicon layer 14 and the N-type grade 20 are exposed by using the third photoresist layer 26A and 26B as a hard mask. Moreover, using the third photoresist layer 26A and 26B as a implanting mask, second conductivity type ions are implanted into the N-type grade regions 20 of high-voltage MOS and into the silicon substrate 10 of low-voltage MOS, and usually the second conductivity ions designated as N⁺. The N⁺-type ions regions of high-voltage MOS and low-voltage MOS are defined source/drain in the substrate 10. It is noted that the concentration of the second conductivity ion areas 28 is higher than the concentration of the first conductivity ions 20 regions mentioned above. Moreover, the third photoresist layer 26A and 26B is removed. Moreover, the exposed polysilicon layer 14 and the grade 20 are sputtered to form self-aligned silicidation regions 30. This silicidation is performed by a traditional process such as self-aligned silicidation (or salicide), which generally includes firstly blanket sputtering a metal Titanium or Cobalt layer over the substrate 10 of high-voltage MOS and low-voltage MOS regions, followed by subjecting the substrate 10 in a high temperature. It makes the metal layer react with the underlying silicon substrate 10, thereby forming silicide region on the gate 14, the source/drain 28 of high-voltage MOS and low-voltage MOS regions, respectively. Those regions not reacted with the metal layer are then removed by, for example, a conventional wet etches. Finally, an inter-layer dielectric (ILD) layer 32A and 32B, such as silicon oxide layer is deposited over the substrate 10 of high-voltage MOS and low-voltage MOS region. Finally, using conventional photolithography techniques to define a contact via 34, the inter-layer dielectric layer 32A and 32B is then patterned and etched to form a contact via 34 therein.

Although specific embodiments have been illustrated and described, it will be obvious to those skilled in the art that various modifications may be made without departing from what is intended to be limited solely by the appended claims.

What is claimed is:

1. A method for forming a semiconductor device, comprising:

providing a substrate on which a high-voltage MOS and a low-voltage MOS transistor region are defined;

forming a plurality of field oxides on said substrate, one of said field oxides being spaced from another of said field oxide by one of the MOS transistor regions;

depositing a polysilicon layer over said high-voltage MOS and low-voltage MOS transistor regions;

depositing a first dielectric layer over said polysilicon layer of said high-voltage MOS and low-voltage MOS transistor regions;

forming a first photoresist layer over said first dielectric layer, wherein said first photoresist layer is defined and etched to form gates of high-voltage MOS and low-voltage MOS transistor;

using a second photoresist layer as a mask above low-voltage MOS transistor regions, and firstly implanting the substrate of said high-voltage MOS transistor region to form first conductivity-type grade therein;

removing said second photoresist layer of the low-voltage MOS transistor region;

forming a plurality of spacers on sidewall of said gates of the high-voltage MOS and low-voltage MOS transistor;

forming a second dielectric layer on said substrate of the high-voltage MOS and the low-voltage MOS transistor;

forming a third photoresist layer having a first pattern on said the high-voltage MOS transistor and a second pattern on said low-voltage MOS transistor, wherein etching a portion of said first dielectric layer and said second dielectric layer is performed until top surface of said polysilicon layer and said grade is exposed by using said third photoresist layer as a hard mask;

implanting second conductivity type ions inside said grade of high-voltage MOS transistor and inside the substrate of the low-voltage MOS transistor using said third photoresist layer as a mask;

removing the third photoresist layer; and sputtering said exposed polysilicon layer and said grade to form silicide region.

2. The method according to claim 1, wherein said first dielectric layer comprises silicon nitride.

3. The method according to claim 1, wherein said second dielectric layer comprises silicon dioxide.

4. The method according to claim 1, wherein said first conductivity-type grade is N-type grade.

5. The method according to claim 1, further comprising implanting first conductivity-ions to form two grades, wherein said two grades are formed only in the internal part of high-voltage MOS transistor region.

6. The method according to claim 1, wherein said second conductivity-type ions are $N^+$-type ions.

7. The method according to claim 1, wherein said first pattern of the third photoresist layer defines self-aligned silicidation regions of the high-voltage MOS transistor.

8. The method according to claim 1, wherein said second pattern of the third photoresist layer defines aligned silicidation regions of the low-voltage MOS transistor.

9. The method according to claim 8, wherein said self-aligned silicidation regions are formed by sputtering Titanium, reacting said Titanium over said substrate of high-voltage MOS transistor region and low-voltage MOS transistor region, and then forming the self-aligned silicidation regions on top surface of said second conductivity-type ions region and the polysilicon layer.

10. The method according to claim 8, wherein said self-aligned silicidation regions are formed by a self-aligned silicidation process.

11. The method according to claim 1, wherein said gate further comprises a polysilicon layer.

12. The method according to claim 1, wherein the thickness of said first dielectric layer is preferably about 500 angstrom.

13. The method according to claim 1, wherein said second dielectric layer on said substrate of high-voltage MOS and low-voltage MOS is formed by thermal oxidation method.

14. A method for forming a semiconductor device, comprising:

providing a silicon substrate on which high-voltage MOS and low-voltage MOS transistor region are defined;

forming a plurality of field oxides on said silicon substrate, one of said field oxides being spaced from another of said field oxide by one of the MOS transistor regions;

depositing a polysilicon layer over said high-voltage MOS and low-voltage MOS transistor regions;

depositing a silicon nitride layer over said polysilicon layer of said high-voltage MOS and low-voltage MOS transistor regions;

forming a first photoresist layer over said silicon nitride layer, wherein said first photoresist layer is defined and etched to form gates of high-voltage MOS and low-voltage MOS transistor;

using a second photoresist layer as a hard mask above low-voltage MOS transistor region, and firstly implanting the substrate of said high-voltage MOS transistor region to form N-type grade therein;

removing said second photoresist layer of the low-voltage MOS transistor region;

forming a plurality of spacers on sidewall of said gates of said high-voltage MOS and said low-voltage MOS transistor;

forming a silicon dioxide layer on said silicon substrate of said high-voltage MOS and said low-voltage MOS transistor by thermal oxidation method;

forming a third photoresist layer having a first pattern on said high-voltage MOS transistor and a second pattern on said low-voltage MOS transistor, wherein etching a portion of said silicon nitride layer and said silicon dioxide layer is performed until top surface of said polysilicon layer and said N-type grade is exposed by using said third photoresist layer as a hard mask;

implanting $N^+$ type ions into said grade of high-voltage MOS and into the substrate of the low-voltage MOS transistor to form source/drain of high-voltage MOS and low-voltage MOS transistor by using said third photoresist layer as a mask;

removing the third photoresist layer;

sputtering said exposed polysilicon layer and source/drain of high-voltage MOS and low-voltage MOS transistor to form silicide region, and depositing an inter-layer dielectric above the substrate, wherein said inter-layer dielectric is etched to form a contact via therein.

15. The method according to claim 14, wherein said implanting ions of said source/drain regions have concentration higher than implanting ions of grade regions.

16. The method according to claim 14, wherein said inter-layer dielectric layer further comprises silicon oxide.

17. The method according to claim 16, wherein said inter-layer dielectric layer is formed by chemical vapor deposition (CVD) method.

18. The method according to claim 14, wherein said silicidation regions comprise Titanium.

19. The method according to claim 14, wherein said silicidation regions comprises metal Cobalt.

20. The method according to claim 14, wherein said first pattern of the third photoresist layer defines silicidation region of the high-voltage MOS transistor.

21. The method according to claim 14, wherein said second pattern of the third photoresist layer defines silicidation region of the high-voltage MOS transistor.

22. The method according to claim 14, wherein the thickness of said silicon nitride layer is preferably about 500 angstroms.

* * * * *